United States Patent
Pawloski et al.

(10) Patent No.: US 7,563,560 B1
(45) Date of Patent: Jul. 21, 2009

(54) SOLUTION AND METHOD FOR MANUFACTURING AN INTEGRATED CIRCUIT

(75) Inventors: Adam R. Pawloski, San Jose, CA (US); Harry J. Levinson, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 527 days.

(21) Appl. No.: 11/047,840

(22) Filed: Feb. 1, 2005

(51) Int. Cl.
*G03F 7/26* (2006.01)
(52) U.S. Cl. .................... 430/311; 430/322
(58) Field of Classification Search ............. 430/322, 430/311
See application file for complete search history.

(56) References Cited

U.S. PATENT DOCUMENTS

| 5,501,877 A * | 3/1996 | Adair et al. ............. 427/249.9 |
| 2004/0048200 A1* | 3/2004 | Ishibashi ...................... 430/311 |
| 2005/0001317 A1* | 1/2005 | Ganapathiraman et al. .. 257/751 |
| 2005/0084794 A1* | 4/2005 | Meagley et al. ........... 430/270.1 |

FOREIGN PATENT DOCUMENTS

JP          2005-109146     * 4/2005

OTHER PUBLICATIONS

English translation of JP Publication 2005-109146, Apr. 2005.*
P. Bertand, A. Jonas, A. Laschewsky, R. Legras; Ultrathin polymer coatings by complexation of polyelectrolytes at interfaces: suitable materials, structure and properties; Macromol. Rapid Commun. 21, No. 7, 319-348, 2000.

* cited by examiner

*Primary Examiner*—Kathleen Duda
*Assistant Examiner*—Brittany Raymond
(74) *Attorney, Agent, or Firm*—Farjami & Farjami LLP

(57) ABSTRACT

A polyelectrolyte solution for tuning a surface energy and a method for using the polyelectrolyte solution to manufacture an integrated circuit. A substrate is provided and a photosensitive material having a surface energy is formed over the substrate. The substrate may be polysilicon, silicon dioxide, silicon nitride, metal, and the like. The photosensitive material is treated with a polyelectrolyte solution to change the surface energy of the photosensitive material. Treatment techniques for applying the polyelectrolyte solution may include spraying, bathing, rinsing, soaking, or washing. The polyelectrolyte adsorbs to the photosensitive material forming a polyelectrolyte polymer layer on the photosensitive material. The photosensitive material may be a photoresist or a photoresist having a topcoat formed thereon. The photosensitive material is exposed using lithography techniques and processed to form a patterned layer of photosensitive material for use in manufacturing the integrated circuit.

21 Claims, 1 Drawing Sheet

US 7,563,560 B1

SOLUTION AND METHOD FOR MANUFACTURING AN INTEGRATED CIRCUIT

FIELD OF THE INVENTION

The present invention relates, in general, to integrated circuit manufacture and, more particularly, to modifying the surface energy of materials used in integrated circuit manufacture.

BACKGROUND OF THE INVENTION

Integrated circuit ("IC") manufacturers are constantly striving to lower their manufacturing costs by increasing the number of semiconductor devices that can be manufactured from a single wafer, i.e., increasing the device density. The formation of various integrated circuit structures from a semiconductor wafer often relies on lithographic processes, sometimes referred to as photolithography. For instance, patterns can be formed from a photoresist layer by passing radiation through a mask (or reticle) having a pattern that will be imaged onto the photoresist layer. As a result, the pattern is transferred to the photoresist layer. For a positive photoresist, in areas where the photoresist is sufficiently exposed and after a development cycle, portions of the photoresist material become soluble such that they can be removed to selectively expose an underlying layer (e.g., a semiconductor layer, a metal or metal containing layer, a dielectric layer, etc.). The portions of the photoresist layer that are not exposed to a threshold amount of radiation will not be removed and remain to protect the underlying layer. The exposed portions of the underlying layer can then be etched (e.g., by using a chemical wet etch or a dry reactive ion etch (RIE)) such that the pattern formed from the photoresist layer is transferred to the underlying layer. Alternatively, the photoresist layer can be used to block dopant implantation into the protected portions of the underlying layer or to retard reaction of the protected portions of the underlying layer. Thereafter, the remaining portions of the photoresist layer can be stripped.

Because of the desire to increase device density, there is a need to increase the resolution capability of lithography systems. One promising alternative to conventional optical lithography is a next-generation lithography technique known as immersion lithography. In immersion lithography, an immersion lithography medium is placed between the final lens of an imaging system and a photosensitive material (e.g., a photoresist) on the surface of a semiconductor wafer. The immersion lithography medium replaces an air (or other gas) gap that is conventionally present between the final lens of a conventional dry lithography imaging system and the wafer. The desired pattern of radiation is transmitted through the immersion lithography medium to the photosensitive material.

A drawback with immersion lithography is that photosensitive films, such as photoresist, are hydrophobic. Similarly, protective topcoat films formed on a photosensitive film are also hydrophobic. When these films are placed in an immersion lithography medium, water present in the immersion lithography medium is repelled owing to their hydrophobic nature. However, it is desirable for water to coat these films so that bubbles are not formed between the lens of the immersion lithography system and the wafer during exposure of the photosensitive film to radiation. In addition, components of photosensitive and topcoat films may leach into the aqueous immersion lithography medium and cause defects. These defects can be chemical residues or printing defects due to contamination that alters the optical properties of the immersion fluid such that the image is distorted during exposure.

Accordingly, it would be advantageous to have a method and solution for tuning surface energies of materials used in manufacturing an integrated circuit. It would be of further advantage for the method and solution to be cost efficient and suitable for use with a variety of materials.

SUMMARY OF THE INVENTION

The present invention satisfies the foregoing need by providing a solution for treating a material surface and a method for treating the material surface with the solution. In accordance with one embodiment, the present invention comprises a method for manufacturing an integrated circuit that includes providing a substrate and forming a layer of photoresist on the substrate. The layer of photoresist is treated with a polyelectrolyte solution. At least one portion of the photoresist layer treated with the polyelectrolyte solution is exposed to radiation via immersion lithography.

In accordance with another embodiment, the present invention comprises a method for tuning a surface energy of a photosensitive material disposed on a first surface, wherein the photosensitive material has a first surface energy. One or more layers of polyelectrolyte material is formed on the photosensitive material, wherein the one or more layers of polyelectrolyte material has a second surface energy. At least one portion of the photosensitive material and the one or more layers of polyelectrolyte material are exposed to radiation.

In accordance with yet another embodiment, the present invention comprises a polyelectrolyte solution for use with immersion lithography in manufacturing a semiconductor component. The polyelectrolyte solution includes a polyelectrolyte material, water, and a pH control agent.

BRIEF DESCRIPTION OF THE DRAWINGS

The present invention will be better understood from a reading of the following detailed description, taken in conjunction with the accompanying drawing figures, in which like reference numbers designate like elements and in which.

DETAILED DESCRIPTION

Generally, the present invention provides a method for treating the surfaces of photoresist films and topcoat films used in the manufacture of integrated circuits. The surfaces of these films have surface energies that make them either hydrophobic or hydrophilic. The surface energy is the amount of energy required to form a new surface between two different media. Thus, for example, when water is placed on a hydrophobic surface, it forms beads rather than a new surface. In accordance with the present invention, a surface is treated with a polyelectrolyte solution to tune its surface energy such that a hydrophobic surface becomes more or less hydrophobic, a hydrophilic surface becomes more or less hydrophilic, a hydrophobic surface becomes hydrophilic, or a hydrophilic surface becomes hydrophobic. Tuning the surface energy changes the hydrophobicity or hydrophilicity of the photoresist surface or the topcoat surface. This is beneficial in integrated circuit manufacture because it changes the attraction between the photoresist film or topcoat film and solvents such as water, thereby making the film more amenable for use with various integrated circuit processes. For example, the surface of a photoresist film may be hydrophobic and thus not suitable for use in immersion lithography. After treatment with the polyelectrolyte polymer solution, the surface becomes hydrophilic which is more compatible with immersion lithography. A benefit of the present invention is that it is not limited to changing the surface energy of a film from a hydrophobic state to a hydrophilic state or vice versa. The surface energy may be changed such that a surface that is hydrophobic may be made more or less hydrophobic or a surface that is hydrophilic may be made more or less hydrophilic.

Figure 1:
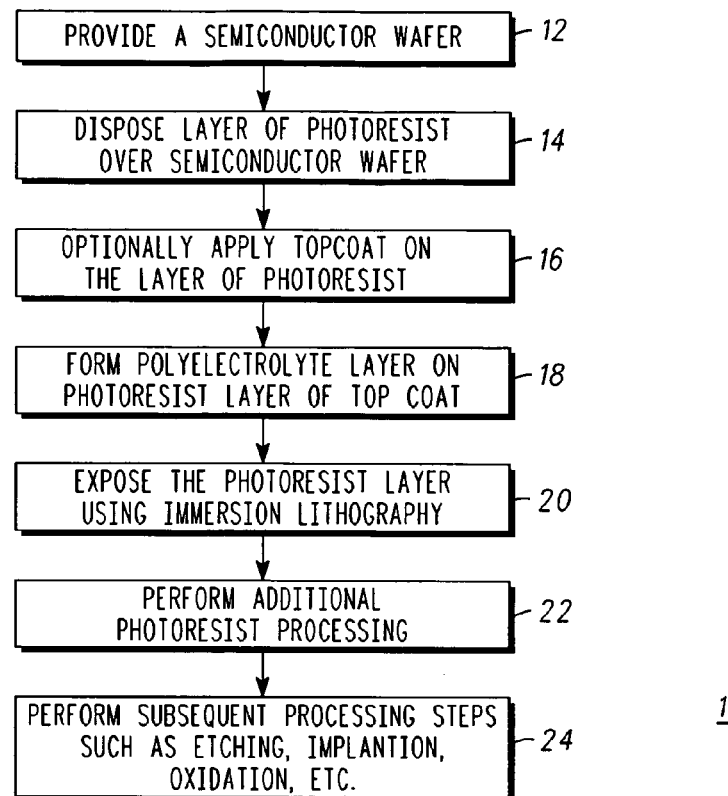
FIG. 1 is a flow diagram of a method for manufacturing an integrated circuit in accordance with an embodiment of the present invention.
Figure 2:
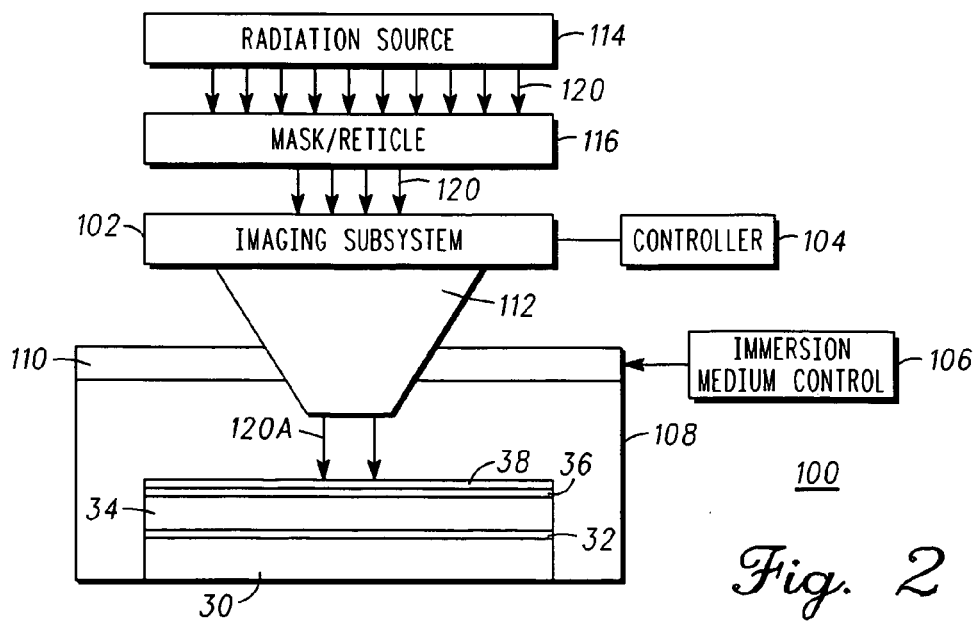
FIG. 2 is a schematic diagram of an immersion lithography system in accordance with an embodiment of the present invention.

FIG. 1 is a flow diagram 10 of a method for manufacturing an integrated circuit in accordance with an embodiment of the present invention. It should be understood that FIGS. 1 and 2 will be described together. In a beginning step identified by reference number 12, a semiconductor wafer 30 is provided. Semiconductor wafer 30 is shown in FIG. 2. Suitable substrates for semiconductor wafer 30 include silicon, silicon germanium, germanium, Silicon-On-Insulator (SOI), gallium arsenide, indium phosphide, other suitable compound semiconductor materials, and the like. Still referring to FIG. 2, a layer of dielectric material 32 is disposed on semiconductor wafer 30 and a polysilicon layer 34 is disposed on dielectric layer 32. Because another material is not disposed on polysilicon layer 34, it is referred to as the top layer. It should be understood that the top layer is not limited to being polysilicon, but can be another material such as, for example, a dielectric material, a metal, a polyimide, or the like. It should be further understood that the number and types of layers disposed over semiconductor wafer 30 is also not a limitation of the present invention.

Referring again to FIG. 1, and in a next step identified by reference number 14, a photoresist layer or film 36 (shown in FIG. 2) is disposed on polysilicon layer 34. Photoresist layer 36 is also referred to as a photosensitive material. The photoresist may be a positive photoresist or a negative photoresist. In an optional step indicated by reference number 16 in FIG. 1, a topcoat film or protective coating may be formed on photoresist layer 36. For example, the topcoat may be an olefinic resin that is cured after being formed on photoresist layer 36. In addition to photoresist layer 36 being referred to as a photosensitive material, the combination of photoresist layer 36 and the topcoat film are also referred to as a photosensitive material. In accordance with one embodiment, photoresist layer 36 and the topcoat are hydrophobic. However, it should be understood that this is not a limitation of the present invention. For example, photoresist layer 36 and the topcoat film may be hydrophilic.

In a next step identified by reference number 18, photoresist layer 36 is contacted or treated with a polyelectrolyte solution to form a polyelectrolyte polymer layer 38 (shown in FIG. 2). If the optional topcoat film is formed on photoresist layer 36, then polyelectrolyte polymer layer 38 is formed on the topcoat film. Preferably, the polyelectrolyte solution comprises a water soluble polyelectrolyte polymer, water, and a pH control agent. In addition, the polyelectrolyte solution may contain an agent to control ionic strength such as a salt. Suitable polyelectrolytes include, but are not limited to, poly (ethyleneimine), poly(allylamine), sodium poly(styrene sulfonate), poly(N,N,N-trimethyl-2-methacryloylethyl ammonium bromide, poly(diallyldimethyl ammonium) chloride, β-cyclodextrin, poly(vinylsulfate), poly(acrylic acid), and poly[N-vinyl-(4-(3'-carboxy-4'-hydroxyphenylazo)benzenesulfonamide. In accordance with one embodiment in which the top surface is a hydrophobic photoresist, the polyelectrolyte solution is a basic solution comprising poly(diallyldimethylammonium chloride) and water. Photoresist layer 36 (or the topcoat film) can be treated by spraying the polyelectrolyte solution on photoresist layer 36, rinsing photoresist layer 36 with a polyelectrolyte solution, bathing photoresist layer 36 in a polyelectrolyte solution, soaking photoresist layer 36 in the polyelectrolyte solution, washing photoresist layer 36 with the polyelectrolyte solution, or the like.

Photoresist layer 36 may have functional groups such as, for example, hydroxyl groups, carboxyl groups, phenolic groups or the like extending from its surface which deprotonate when treated with the alkaline polyelectrolyte solution. After deprotonation, photoresist layer 36 has a net negative surface charge. The polyelectrolyte polymer then adsorbs to the surface of deprotonated photoresist layer 36 forming a polyelectrolyte polymer layer 38. Because the polyelectrolyte polymer has a net positive charge that is greater than the net negative charge of the deprotonated photoresist layer, the net charge of the photoresist-polyelectrolyte polymer is positive. When the semiconductor wafer over which photoresist layer 36 and polyelectrolyte polymer layer 38 are disposed is removed from the polyelectrolyte solution, polyelectrolyte polymer layer 38 remains adsorbed to photoresist layer 36. Because polyelectrolyte polymer layer 38 is adsorbed to photoresist layer 36, it forms a surface on photoresist layer 36 that is hydrophilic when photoresist layer 36 is placed in water that is pH neutral.

Although, photoresist layer 36 has been described as having a net negative charge, and hence being hydrophobic, it should be understood this is not a limitation of the present invention. The surface of the photoresist layer or the topcoat film can become positively charged in the polyelectrolyte solution. Here, a suitable polyelectrolyte would be negatively charged in an alkaline aqueous solution. For example, the polyelectrolyte solution may be an alkaline solution comprising poly(acrylic acid) and water. It should be understood that the pH of the polyelectrolyte solution is not a limitation of the present invention, i.e., the solution can have an alkaline, acidic, or neutral pH. In other words, the polyelectrolyte of the polyelectrolyte solution is soluble in an aqueous base or an aqueous acid.

Alternatively, a multi-layer polyelectrolyte film can be formed on the photoresist layer or the topcoat film. In accordance with one embodiment, the multi-layer polyelectrolyte film is formed by adsorbing a polyelectrolyte polymer to the photoresist layer to form polyelectrolyte polymer layer 38 as described hereinbefore. After forming polyelectrolyte polymer layer 38, it is treated with an alkaline polyelectrolyte solution comprising poly(acrylic acid) and water. Because the poly(acrylic acid) has a net negative charge in an alkaline solution, it is adsorbed on the polyelectrolyte polymer layer 38, which has a net positive charge. Thus a multi-layer polyelectrolyte polymer film is formed comprising a layer of poly(acrylic acid) adsorbed to a layer of poly(diallyldimethlyammonium chloride). If desired, alternating polymeric layers of poly(diallyldimethlyammonium chloride) and poly (acrylic acid) can be adsorbed to each other to form a multi-layer polymeric film of the desired thickness.

In a next step indicated by reference number 20, the wafer is placed in an immersion lithography system such as system 100 shown in FIG. 2 and predetermined portions of photoresist layer 36 are exposed to radiation. Still referring to FIG. 2, immersion lithography system 100 includes an imaging subsystem 102, a controller 104, an immersion medium control 106, and an immersion lithography medium 108 in a chamber 110. Imaging subsystem 102 includes a lens 112 that extends into the immersion lithography medium 108 present in chamber 110. In accordance with one embodiment, immersion lithography medium 108 fills the space between photoresist layer 36-polyelectrolyte polymer layer 38 and lens 112. The space or gap between photoresist layer 36-polyelectrolyte polymer layer 38 and lens 112 ranges from about 50 micrometers (μm) to about 5 millimeters (mm). In operation, radiation 120 from a radiation source such as, for example, a light source 114 passes through a mask 116 (or a reticle) and into imaging subsystem 102, which focuses the radiation. The radiation is transmitted through lens 112, through immersion lithography medium 108, through polyelectrolyte polymer layer 38 and into the desired portions of photoresist layer 36. Thus, the desired portions of photoresist layer 36 are exposed to focused radiation 120A.

After photoresist layer 36 has been exposed, semiconductor wafer 30 and photoresist layer 36 are dried. Suitable drying techniques include blow drying, drying in an oven, air drying, and the like.

In a next step indicated by reference number 22, photoresist layer 36 is subjected to additional processing steps including post-exposure bake, development, hard bake, and measurement or inspection to form a patterned layer of photoresist.

In subsequent steps indicated by reference number 24, semiconductor wafer 30 is then subjected to processing steps using the patterned photoresist layer as a mask. For example, semiconductor wafer 30 may be subjected to an etching step to form one or more gate structures from semiconductor layer 34 and dielectric layer 32. Alternatively, the etching step may form trenches or openings for use in subsequent processing such as interconnect formation. In these types of steps, the patterned photoresist layer serves as an etch mask. Alternatively, the patterned photoresist layer may serve as an implant mask. As those skilled in the art are aware, integrated circuits are manufactured by repeating a series of processing steps that include the use patterned photoresist layers. Thus, the subsequent processing steps may include ion implantation, metallization, oxidation, planarization, etc. Before each of these steps, a photoresist layer is formed over materials such as oxide, nitride, polysilicon, metals, or the like, treated with a polyelectrolyte solution, and exposed using immersion lithography or conventional lithography in accordance with the present invention.

By now it should be appreciated that a solution and a method for tuning the surface energy of a photoresist layer or a topcoat film have been provided. In accordance with one aspect, the surface energy of the photoresist layer or the topcoat film is tuned by adsorbing a polyelectrolyte to the photoresist layer to form a polyelectrolyte polymer layer. An advantage of the present invention is that the polyelectrolyte polymer layer does not degrade the intensity of radiation interacting with the photoresist layer. Further, the polyelectrolyte polymer layer improves wettability of photoresist layers and topcoat films which improves developer coverage. Improving developer coverage reduces the amount of developer consumed in integrated circuit manufacture and improves process control. Improving wettability also inhibits the formation of bubbles between an immersion lithography lens system and a photoresist layer or a topcoat layer. Inhibition of bubble formation decreases the number of processing defects that arise during immersion lithography. Another advantage is that the polyelectrolyte polymer layer can be tailored to increase the etch resistance of the photoresist layer or the topcoat film. Thus, for immersion lithography, the present invention reduces defects, especially bubble formation, during the exposure scan, which increases manufacturing yield.

It should be understood that the present invention also provides benefits for traditional lithography techniques such as, for example, I-line, deep-ultra-violet (deep-UV), and extreme-UV. In these processing techniques, it is desirable to expose the photoresist layer to radiation before adsorbing the polyelectrolyte to the photosensitive film, e.g., the photoresist layer. Thus, the order of adsorption of the polyelectrolyte polymer on the photoresist layer is not a limitation of the present invention, i.e., adsorption can occur before or after exposure of the photoresist. Advantages of adsorbing the polyelectrolyte polymer after exposing the photoresist layer are that it allows control of the surface energy of the photoresist film after exposure and it allows coating an additional layer on patterned resist structures in order to change their physical dimensions. In the latter advantage, it is preferable that the polyelectrolyte polymer be adsorbed to the photosensitive material after development. Thus, single or multiple layers of polyelectrolyte polymer can be deposited on patterned features in the photoresist such that the dimensions of those patterned features change. For example, the sizes of openings or holes can be shrunk.

Yet another advantage of tuning surface energies is that it smoothes the surface of the photoresist, thereby decreasing line-edge roughness. Thus, this technique provides for narrower critical dimension (CD) distributions, greater functionality, and improved yield. In addition, the solution and method are readily integrable into immersion and non-immersion lithography processing flows in a cost and time efficient manner.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method for manufacturing an integrated circuit, comprising:
    providing a substrate;
    forming a layer of photoresist on the substrate;
    treating the layer of photoresist with a polyelectrolyte solution; and
    exposing at least one portion of the layer of photoresist treated with the polyelectrolyte solution to radiation via immersion lithography;
    wherein treating the layer of photoresist with the polyelectrolyte solution causes a polyelectrolyte to be adsorbed to the layer of photoresist so as to increase wettability of the layer of photoresist.

2. The method of claim 1, wherein providing the substrate includes providing a substrate selected from the group of substrates consisting of silicon, polysilicon, dielectric material, metal, gallium arsenide, indium phosphide, and compound semiconductor material.

3. The method of claim 1, further including baking the layer of photoresist.

4. The method of claim 1, wherein treating the layer of photoresist includes contacting the layer of photoresist with the polyelectrolyte solution using a technique selected from the group of techniques consisting of spraying, rinsing, soaking, and washing.

5. The method of claim 1, wherein treating the layer of photoresist includes placing the layer of photoresist in a bath of the polyelectrolyte solution.

6. The method of claim 1, wherein the polyelectrolyte is selected from the group of polyelectrolytes consisting of poly(ethyleneimine), poly(allylamine), sodium poly(styrene sulfonate), poly(N,N,N-trimethyl-2-methacryloylethyl ammonium bromide, poly(diallyldimethyl ammonium) chloride, β-cyclodextrin, poly(vinylsulfate), poly(acrylic acid), and poly[N-vinyl-(4-(3'-carboxy-4'-hydroxyphenylazo)benzenesulfonamide.

7. The method of claim 1, wherein the polyelectrolyte of the polyelectrolyte solution is water soluble polyelectrolyte.

8. The method of claim 1, wherein the polyelectrolyte of the polyelectrolyte solution is soluble in one of an aqueous base or an aqueous acid.

9. The method of claim 1, wherein treating the layer of photoresist with the polyelectrolyte solution forms at least one layer of the polyelectrolyte on the layer of photoresist.

10. A method for tuning a surface energy of a photosensitive material in the manufacture of an integrated circuit, comprising:
    disposing the photosensitive material on a first surface, wherein the photosensitive material has a first surface energy;
    forming at least one layer of polyelectrolyte material on the photosensitive material, the at least one layer of polyelectrolyte material having a second surface energy; and
    exposing at least one portion of the photosensitive material and the at least one layer of polyelectrolyte material to radiation;
    wherein forming the at least one layer of polyelectrolyte material comprises adsorbing the polyelectrolyte material to the photosensitive material so as to tune the first surface energy of the photosensitive material, thereby decreasing line-edge roughness of the photosensitive material.

11. The method of claim 10, further including forming the at least one layer of polyelectrolyte material before exposing the at least one portion of the photosensitive material.

12. The method of claim 11, further including forming the at least one layer of polyelectrolyte material after exposing the at least one portion of the photosensitive material.

13. The method of claim 10, wherein disposing the photosensitive material on the first surface includes disposing photoresist on the surface.

14. The method of claim 10, wherein disposing the photosensitive material on the first surface includes disposing the photosensitive material on a first surface selected from the group of surfaces consisting of a monocrystalline semiconductor surface, a polycrystalline semiconductor surface, a dielectric surface, a metal surface, and a polymeric surface.

15. The method of claim 10, wherein disposing the photosensitive material on the first surface includes:
    disposing a layer of photoresist on the first surface; and
    disposing a topcoat film on the layer of photoresist, wherein the topcoat film and the layer of photoresist cooperate to form the photosensitive material.

16. The method of claim 10, wherein forming the at least one layer of polyelectrolyte material includes applying the polyelectrolyte material using a technique selected from the group of techniques consisting of spraying, rinsing, soaking, bathing, and washing.

17. The method of claim 10, wherein the first surface energy is a hydrophilic surface energy and the second surface energy is a hydrophobic surface energy.

18. The method of claim 10, wherein the first surface energy is a hydrophobic surface energy and the second surface energy is a hydrophilic surface energy.

19. The method of claim 10, wherein the second surface energy is one of more hydrophobic or less hydrophobic than the first surface energy.

20. The method of claim 10, wherein the second surface energy is one of more hydrophilic or less hydrophilic than the first surface energy.

21. The method of claim 10, wherein forming the at least one layer of polyelectrolyte material includes using a water soluble polyelectrolyte material.

\* \* \* \* \*